United States Patent [19]
Arienzo et al.

[11] Patent Number: 4,752,812
[45] Date of Patent: Jun. 21, 1988

[54] PERMEABLE-BASE TRANSISTOR

[75] Inventors: Maurizio Arienzo, Chappaqua; Donelli J. DiMaria, Ossining, both of N.Y.

[73] Assignee: International Business Machines Corporation, Armonk, N.Y.

[21] Appl. No.: 2,076

[22] Filed: Jan. 12, 1987

[51] Int. Cl.$^4$ .......................................... H01L 49/02
[52] U.S. Cl. ..................................... 357/6; 357/4; 357/59; 357/54; 357/23.15
[58] Field of Search ............... 357/6, 59 H, 59 E, 4, 357/23.15, 54

[56] References Cited

U.S. PATENT DOCUMENTS

| | | | |
|---|---|---|---|
| 4,104,675 | 8/1978 | DiMaria | 357/54 |
| 4,217,601 | 8/1980 | DiMaria et al. | 357/6 X |
| 4,472,726 | 9/1984 | DiMaria et al. | 357/6 |
| 4,647,958 | 3/1987 | Gardner | 357/59 H |

Primary Examiner—Martin H. Edlow
Attorney, Agent, or Firm—Pollock, Vande Sande & Priddy

[57] ABSTRACT

A semiconductor structure that includes a semiconductor substrate; an insulating layer adjacent the substrate; a semiconductor or conductor grid adjacent the insulating layer; another insulating layer adjacent the semiconductor grid; and an injector adjacent the second insulating layer. The injector includes a layer of silicon-rich insulator material and a layer of semiconductor material adjacent the silicon-enriched material.

11 Claims, 9 Drawing Sheets

FIG. 9

PERMEABLE-BASE TRANSISTOR

TECHNICAL FIELD

The present invention is concerned with semiconductor permeable-base transistors and, particularly, transistors based on insulators as the controlling layers for current flow.

Permeable-base transistors, in accordance with the present invention, are especially suitable as current switching devices or voltage amplifiers. In other words, the permeable-base transistors within the scope of the present invention are solid-state analogs of the vacuum tube (triode) or tetrode, respectively.

BACKGROUND ART

Permeable-base transistors have been suggested previously. In particular, devices have been suggested wherein the collector or anode and the emitter or cathode regions are formed exclusively from a semiconductor such as silicon, as suggested by Rothman, et al. in IEDM Technical Digest 1982 (IEEE, New York, 1982) pages 650-653 and Nishizawa, et al., IEEE Trans. Electron Devices ED-22, 185 (1975), or gallium arsenide, as discussed by Bozler, et al., IEEE Trans. Electron Devices ED-27, 1128 (1980). Rothman, et al., supra, and Bozler, et al., supra, suggest that the base region be formed from a metal. Nishizawa, et al., supra, suggest a base region formed from degenerate-semiconductor fingers.

In these devices, unipolar current flow from the emitter to the collector is controlled by carrier motion through the semiconducting regions that separate the base regions. These base regions act like a gate by either allowing carriers to pass through or not, depending upon the potential barriers created by the specific voltage bias conditions. Since these devices are limited by bulk current flow through the semiconducting regions, fast switching speeds are attainable, particularly for those structures fabricated with gallium arsenide which has a higher mobility than silicon. However, since the grid spacing must be comparable to the depletion width, submicron technologies are needed in the design of the devices.

SUMMARY OF THE INVENTION

The present invention is concerned with a novel, permeable base semiconductor device. In particular, the present invention is concerned with a semiconductor structure that comprises a semiconductor substrate having an insulating layer adjacent the substrate. At least one conductor or semiconductor grid is adjacent the insulating layer and is physically separated from the substrate by the insulating layer. A second insulating layer is adjacent the conductor or semiconductor grid. Adjacent the second insulating layer is an injector which is separated from the conductor or semiconductor grid by the second insulating layer. The injector includes a layer of silicon-rich insulator material and a layer of semiconductor material adjacent the silicon-enriched insulator material. The silicon-enriched insulator material is adjacent the second insulating layer.

The permeable-base transistors of the present invention are especially suitable in providing switching devices that can be considered as solid-state analogs of vacuum tubes or triodes and voltage amplifiers that can be considered solid-state analogs of tetrodes.

Best and Various Modes for Carrying out the Invention

For convenience, the discussion of the semiconductor structures of the present invention is directed to the preferred aspects of employing an n-type silicon substrate and p-type impurities therein as the diffused or implanted dopant impurities. This leads to the p-type channel FET configuration. Accordingly, it is understood that a p-type substrate and an n-type diffused or implanted dopant impurities therein can be employed according to the present invention in the n-type channel FET technology.

It is understood that when the discussion refers to p-type impurities, the present invention is applicable to n-type impurities and vice-versa. Also, when reference is made to impurities of a "first type" and to impurities of the "second type", it is understood that the "first type" refers to n-type or p-type impurities and "second type" refers to the opposite conductivity type. That is, if the "first type" is p, then the "second type" is n. If the "first type is n, then the "second type" is p.

Figure 1:
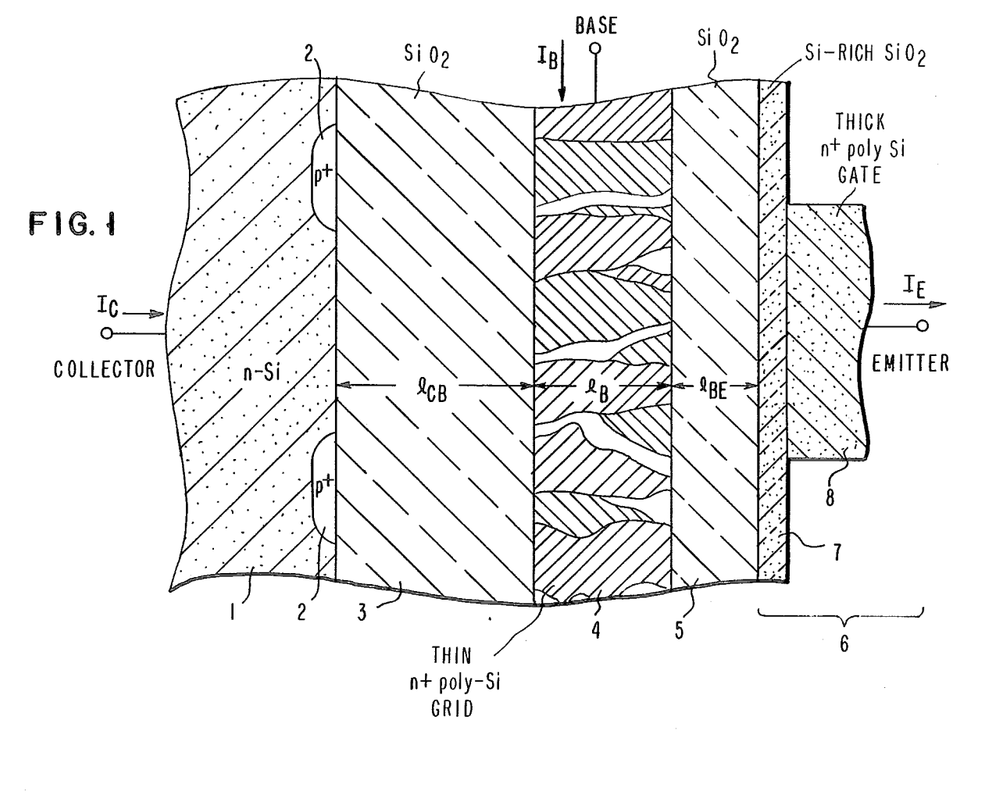
FIG. 1 is a schematic diagram of a permeable-base transistor in accordance with the present invention.

Referring to FIG. 1, there is shown a schematic diagram of a semiconductor device in accordance with the present invention and, particularly, a permeable-base switching device employing stacked layers of silicon, silicon dioxide, and silicon-rich silicon dioxide.

In particular, numeral 1 refers to the substrate which, in the case of the device illustrated in FIG. 1, is an n-type silicon substrate. The n-type silicon substrate (1)

can have any desired crystal orientation (e.g., <100>) and can be prepared by slicing and polishing an n-type silicon boule grown in the presence of an n-type dopant such as arsenic, phosphorus, or antimony following conventional crystal growth techniques.

The substrate is doped in desired locations (2) by known techniques with a p-type dopant such as boron, aluminum, gallium, and indium.

An insulator layer (3) is provided on the substrate (1). Such can be provided by any of the known processing techniques such as disclosed by DiMaria, et al., Journal Applied Physics, 57, 1214 (1985). The insulator layer (3) can be a silicon dioxide layer having a thickness generally of about 50 to about 3500 angstroms and preferably about 80 to about 1000 angstroms. The silicon dioxide layer can be provided by any of the known techniques such as by being thermally grown in the presence of dry oxygen at a temperature of about 900° C. to about 1100° C.

Adjacent the insulating layer (3) is a conductor or semiconductor grid (4) such as n-doped polycrystalline silicon. In place of polycrystalline silicon, the grid can be a metal such as aluminum, titanium, or chromium, or an intermetallic silicide such as platinum silicide or palladium silicide. The grid layer (4) is generally about 50 angstroms to about 1 micron thick and preferably about 500 to about 1000 angstroms thick. The grid layer (4) may be formed of polycrystalline silicon by chemical-vapor deposition and n-doped with, for example, phosphorus. The polycrystalline silicon can be doped, for instance, by depositing a $POCl_3$ layer and heating it to approximately 870° C. to drive the phosphorus into the polysilicon making it n-type. After this, the residual of the $POCl_3$ layer is removed by etching in buffered hydrofluoric acid. Typical resistivities of a doped polysilicon layer grid employed in accordance with the present invention is about 0.05 to about 0.07 ohms-centimeter as determined by a four-point probe technique. The conductor or semiconductor layer is patterned to form a grid-like structure by employing well-known masking and etching techniques. For instance, the polycrystalline silicon can be patterned by etching in well-known etchants such as ethylene diamine pyrocatechol at about 100° C. Usually, the area of the grid structure will contain at least about 1% void spaces, more typically about 1% to about 80% void spaces, and preferably about 50% void spaces. A typical pattern is a gridded mesh structure with 1 micron×1 micron square holes.

Adjacent the semiconductor or conductor grid layer (4) is a second insulating layer (5). This insulating layer (5) is typically about 50 to about 1000 angstroms thick; an example of which is about 750 angstroms. The insulating layer (5) can be silicon dioxide and can be provided by chemical vapor deposition such as at about a temperature of about 700° C.

Adjacent the second insulating layer (5) is an injector (6). The injector includes a layer (7) of silicon-rich insulator material and a layer of semiconductor or conductor material (8). The silicon-rich insulator material layer (7) is adjacent the second insulating layer (5). The silicon-rich insulator layer is typically about 100 to about 1000 angstroms thick, typical of which is about 200 angstroms. The silicon-rich insulating layer such as silicon-rich silicon dioxide can be provided by chemical vapor deposition techniques at about 700° C. The silicon rich layer (7) usually contains at least about 10% excess atomic silicon and generally up to about 50% excess atomic silicon. A typical example being about 12% excess atomic silicon. In addition, both the silicon dioxide layer (5) and the silicon-rich silicon dioxide layer (7), after deposition, can be annealed at about 1000° C. in nitrogen in order to reduce any electron trapping therein.

Adjacent the silicon-rich silicon dioxide layer (7) is a semiconductor or conductor layer (8). Layer (8) is preferably polycrystalline silicon. However, metals or metallic silicides of the type referred to hereinabove can be employed as the layer (8). The layer (7) is generally about 1000 angstroms to about 1 micron thick, a typical example being about 3000 angstroms thick. When polycrystalline silicon is employed, the layer (8) is n-type doped. The layer (8) can be provided in the same manner as was layer (4).

The combination of the silicon-rich insulator layer (7) and layer (8) are considered to be the emitter with the layer (8) being the top gate. Layer (4) is considered the base of the above device and layer (1) can be referred to as the collector.

Ohmic electrical connections are made to each of the emitter, base, and collector as illustrated in FIG. 1.

The permeable-base switching device of the type illustrated in FIG. 1 is based on insulator layers, as the controlling layers for current flow rather than semiconductors, as in the prior art. The silicon-rich insulating layer (7) minimizes low-voltage break down phenomena triggered by irregularities at silicon dioxide/contacting electrode interfaces by forming reversible space charge layers on the near-by silicon islands which field screen premature current injection from these irregularities as discussed by DiMaria, et al., Journal Applied Physics, 51, page 2722 (1980) and DiMaria, et al., Journal Applied Physics, 52, page 4825 (1981). The grid layer (3) allows field line penetration from the gate layer (8) to the silicon substrate collector region. In addition, for large negative base voltages, most of the emitter current flows to the collector. For positive base voltages, most of the emitter current flows to the base.

Figure 3:
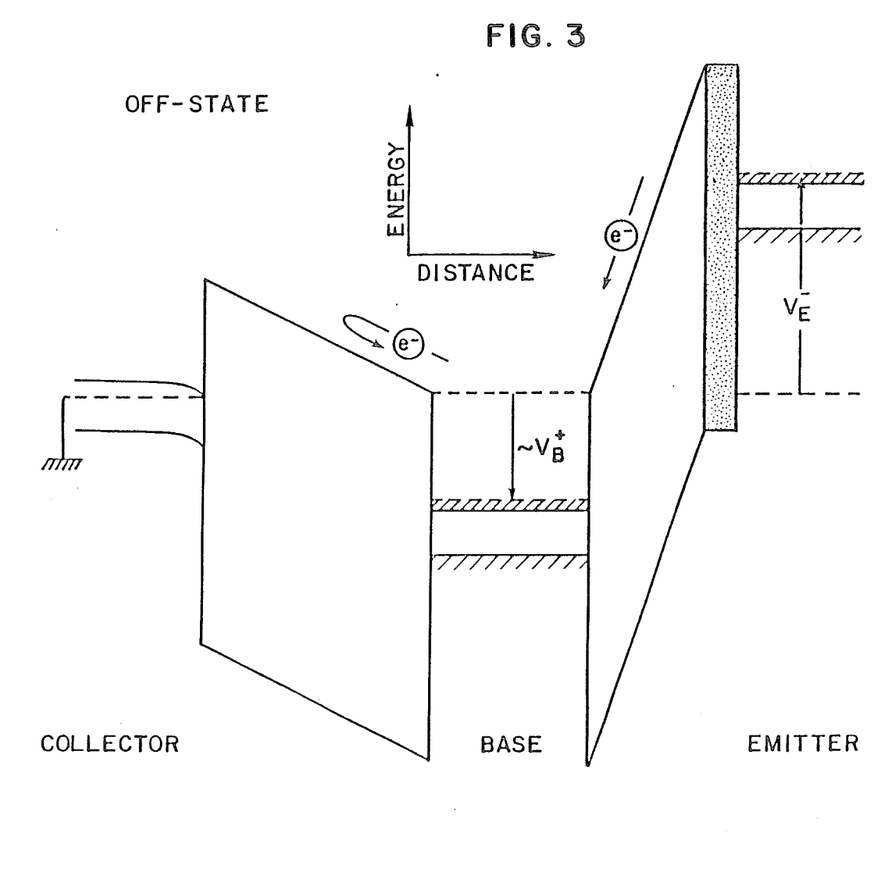
FIG. 3 is a schematic diagram of energy band representation for the "off-state" of the device of the type illustrated in FIG. 1.

FIG. 3 is a schematic energy band representation for the "off state" of the device illustrated in FIG. 1. In this situation, the base voltage is positive and the emitter voltage is negative with respect to the collector which is held near ground. Accordingly, very little current can reach the collector as illustrated in FIG. 3.

Figure 4:
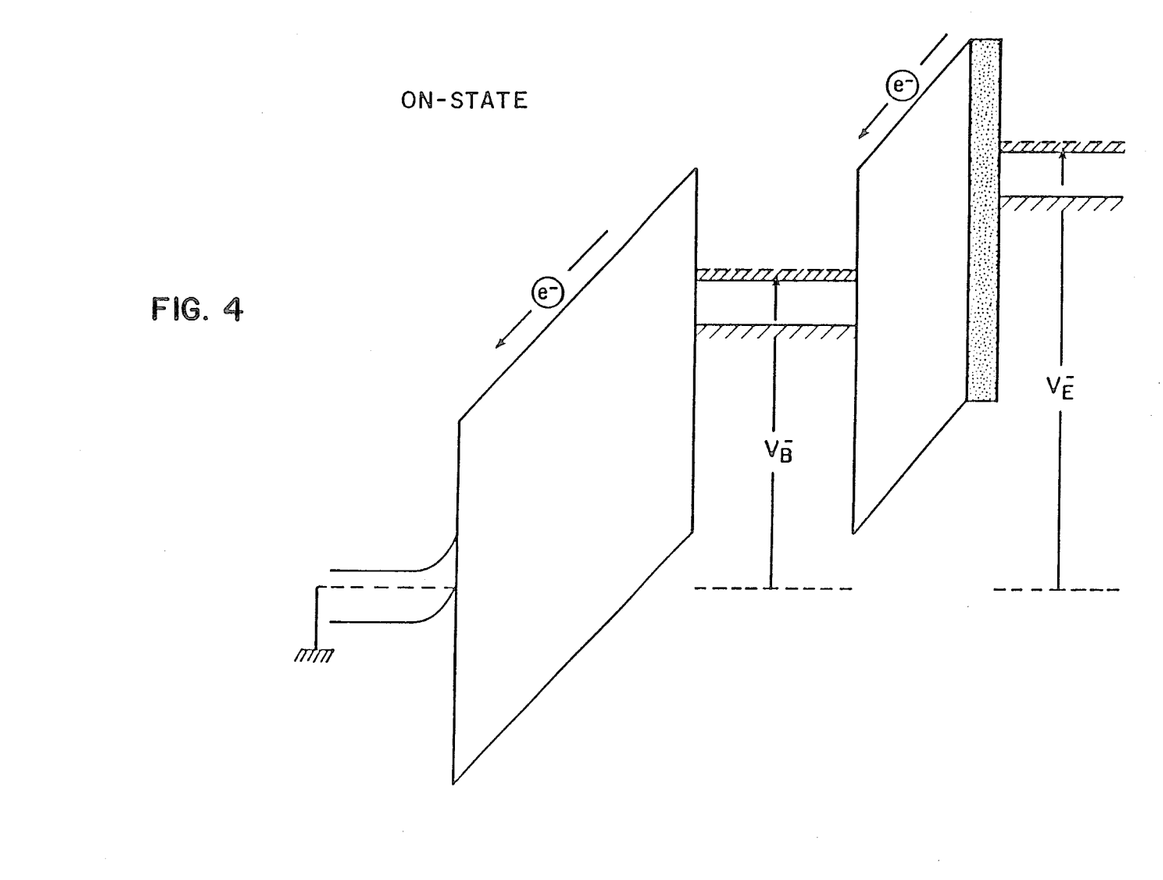
FIG. 4 is a schematic diagram of energy band representation for the "on-state" of the device of the type illustrated in FIG. 1.

FIG. 4 is a schematic energy band representation for the "on state" of the permeable-base switching device illustrated in FIG. 1. For this case, the base and emitter are held at negative voltages relative to the grounded collector. In this situation, a significant fraction of the electrons injected from the emitter reach the collector with the base drawing very little current. In the device illustrated in FIG. 1, the base can draw significant current during the "off state" of the device.

Figure 5:
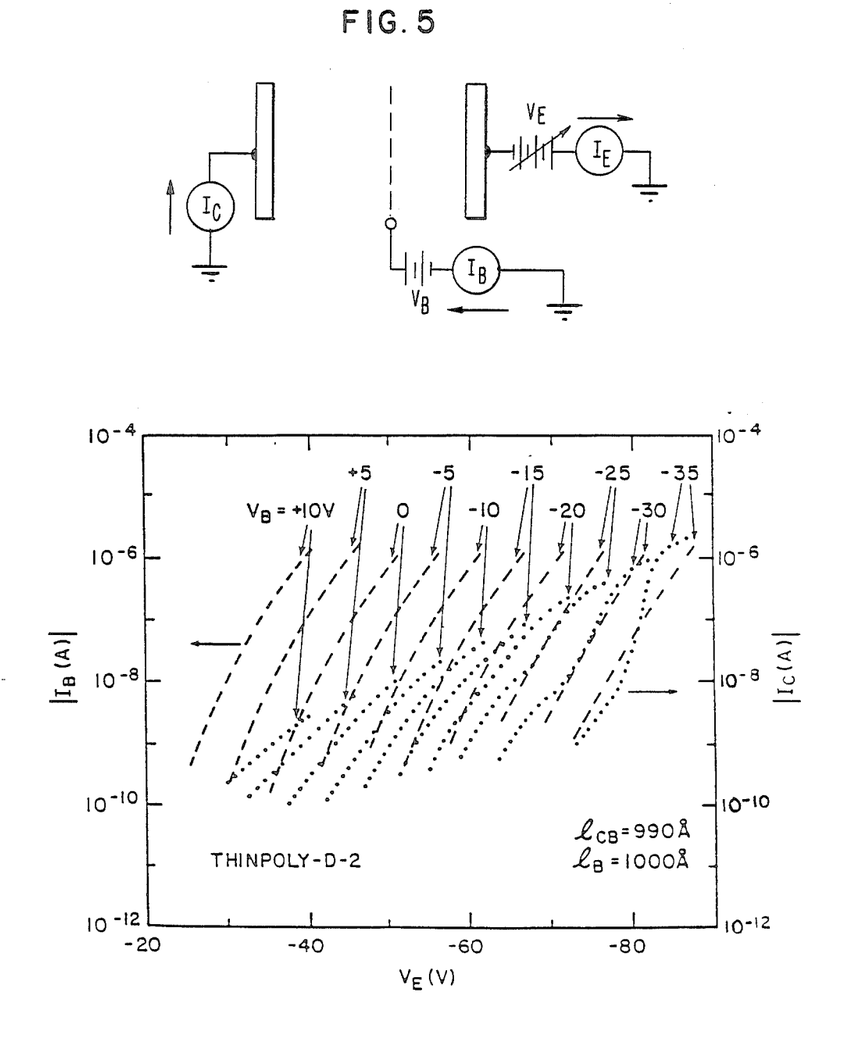
FIG. 5 illustrates the base and collector currents as a function of ramped emitter voltage for a constant base voltage condition for the device of the type illustrated in FIG. 1. The base current is represented by the dashed lines and the collector current is represented by the dotted lines.
Figure 6:
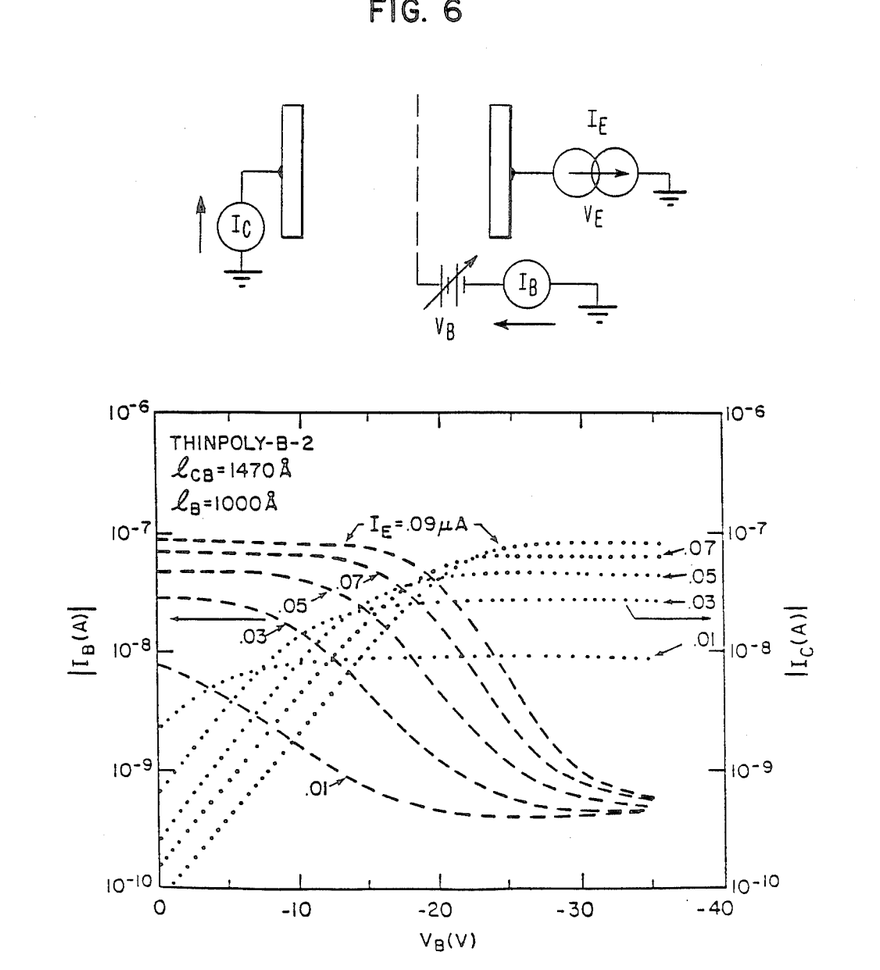
FIG. 6 is a representation of the base and collector currents as a function of ramped base voltage for a constant emitter current condition for a device of the type illustrated in FIG. 1. The base current is represented by the dashed lines and the collector current is represented by the dotted lines.
Figure 7:
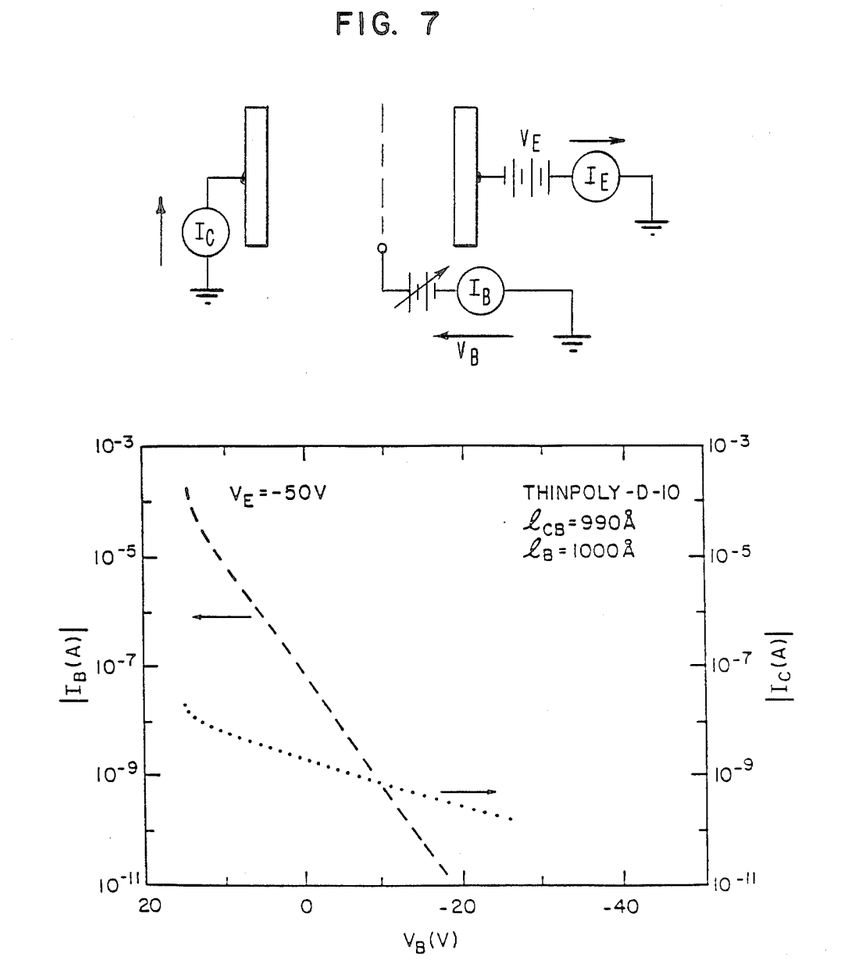
FIG. 7 is a plot of base and collector currents as a function of ramped base voltage for a constant emitter voltage condition for the device of the type illustrated in FIG. 1. The base current is represented by the dashed line and the collector current is represented by the dotted line.

Several types of DC current as a function of voltage (I.V.) measurements are performed at room temperature as illustrated by the representative data in FIGS. 5-7. Voltages are applied to the emitter gate ($V_E$) and the grid or base ($V_B$) with the n-substrate and $p^+$-diffusion dopants connected together and held near ground potential ($V_C = 0$ V). The total substrate and diffusion current ($I_C$), grid current ($I_B$), and emitter current ($I_E = I_B + I_C$) are measured. The data reported in FIGS. 5-7 are obtained by measuring $I_C$ and $I_B$ for various voltage biasing conditions. With the collector always held near ground, either a constant voltage or constant current condition is applied to one of the other terminals while the remaining terminal is ramped at a constant rate (typically about 0.25 V/seconds). In FIG. 5, $V_B$ is held at a constant value while $V_E$ is ramped to more negative values. In FIGS. 6 and 7, $I_E$ and $V_E$ are held constant, respectively, while $V_B$ is ramped to more negative values.

Since the device of the type illustrated in FIG. 1 is based on a p-channel FET configuration, carrier separation measurements are performed to determine the effects of carrier heating on the device operation along the lines suggested by DiMaria, et al., Journal Applied Physics, 57, page 1214 (1985). Carrier separation is performed by measuring separately the p-channel FET currents from the source/drain contacts and the substrate under conditions similar to those illustrated in FIGS. 5–7. The substrate current is comprised of the incident and secondary electrons produced by impact ionization of the incident hot carriers as they enter the silicon substrate. The source/drain currents are due to the secondary holes produced by this ionization process which are collected through the inversion layer. From these currents, the ionization coefficient is determined and compared to the theoretical calculations of Alig, et al., Phys. Rev. B22, page 5565 (1980) to determine the average energy of the incoming hot electron distribution as discussed by DiMaria, et al., Journal Applied Physics, 57, page 1214, (1985). With respect to FIG. 5, sets of curves for $I_C$ and $I_B$ at constant $V_B$ illustrate the transition from the "off" state (the ratio of the magnitude of $I_B/I_C$ is large) at positive values of $V_B$ to the "on" state (the ratio of the magnitude of $I_B/I_C$ is small) at large negative values of $V_B$. For the "off" state, as illustrated in FIG. 3, most of the current flows to the grid or base with very little current flow to the substrate or collector. FIG. 5 indicates that for any one set of basing collector current characteristics, except at the lower current levels for the largest negative base voltages, the transfer efficiency (defined as $\alpha = I_C/I_E$) decreases as the base current increases. Accordingly, the magnitude of the voltage drop from emitter to base increases.

As the data in FIG. 6 illustrates, when a constant emitter current condition is employed, as the base voltage increases to more negative values, almost all of the current will eventually flow to the substrate or collector. The saturation level of the collector current occurs when the magnitude of the electric field for the field lines from the emitter penetrating through the base to the collector is comparable to or larger than those that terminate on the base electrode. This is further illustrated in the schematic energy band diagram in FIG. 4.

FIG. 7 illustrates that in addition to straight-through field line penetration, electron heating can contribute somewhat in the switching operation of the device illustrated in FIG. 1. For the data in FIG. 7, the emitter to collector voltage drop is held constant, while the emitter to base voltage drop is decreased. As illustrated, the collector current is not constant, and it decreases slowly compared to the base current as the base voltage is made more negative. This suggests that the collector current is a function of the base current, particularly at more positive values of the base voltage, due to hot electron transfer between field lines. Electron heating with dispersive transport at electric field magnitudes above 2 MV/cm is known as discussed by DiMaria, et al., Journal Applied Physics, 57, page 1214 (1985) and DiMaria, et al., Phys. Rev. Lett. 56, page 1284 (1986).

In addition, it has been observed that the magnitude of the voltages needed for operation of the switching devices of the type in FIG. 1 is not significantly changed by varying the thickness of the silicon dioxide region located between the collector and the base. Increasing $l_{cB}$, does not have a large effect on either the threshold point for significant collector current flow, nor the slope of the IV data reported in FIG. 8 prior to reaching saturation. Increasing the injector silicon dioxide thickness in the region located between the emitter and the base results in increasing the voltage drop between these two terminals necessary for current injection.

Figure 8:
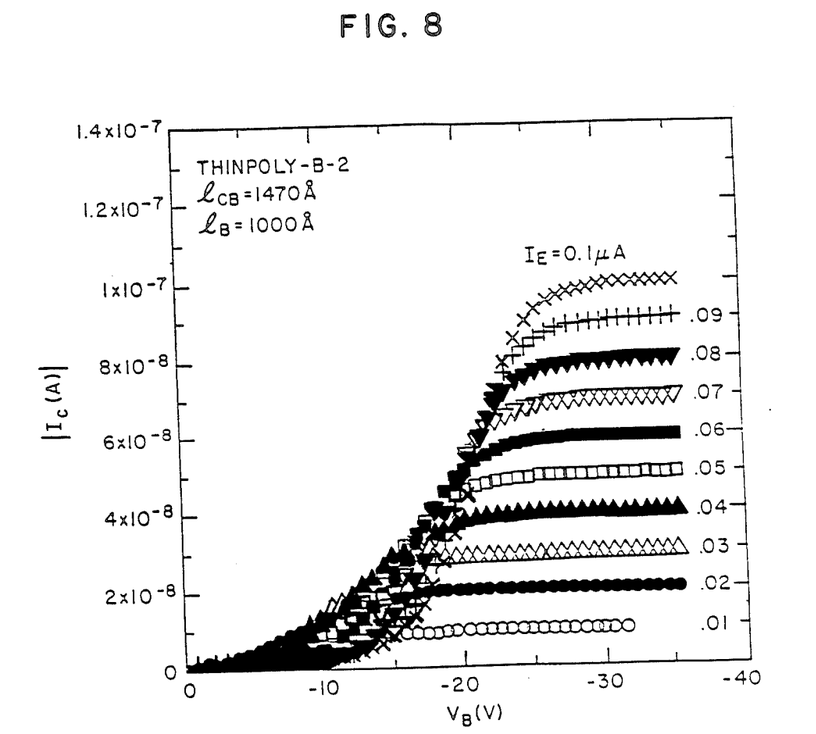
FIG. 8 is a plot of collector current versus base voltage for various constant emitter currents on the device of the type illustrated in FIG. 1.

For the thickest collector to base oxide layer studied ($l_{cB}=3400$ angstroms), a large shift in the operating point with a small decrease in the slope of the I–V characteristics is observed. Besides the influence of charge trapping on this data, the lack of electron heating for this case could influence the results since the electric fields are $\leq 2$ MV/cm. The long term reliability of any device that depends on current flow through silicon dioxide layers will be limited by electron trapping in the oxide as expressed by DiMaria, et al., Journal Applied Physics, Vol. 57, page 1214 (1985); DiMaria, et al., Journal Applied Physics, Vol. 51, page 4830 (1980); and Feigl, et al., Journal Applied Physics, Vol. 52, page 5665 (1981).

Figure 9:
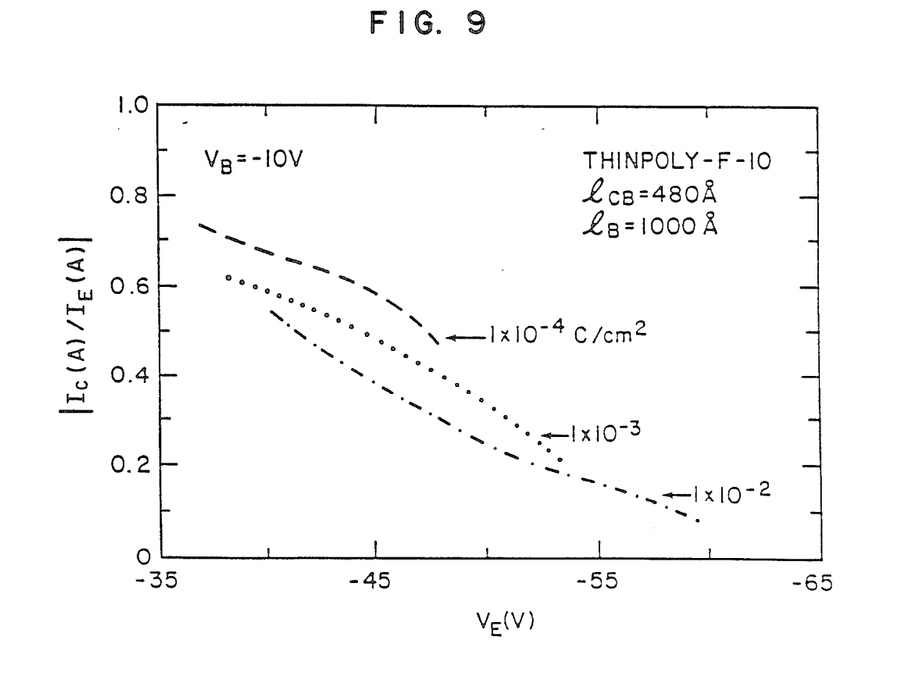
FIG. 9 is a plot of the ratio of collector to emitter current as a function of ramped emitter voltage for a constant base voltage for a device of the type illustrated in FIG. 1. Various curves correspond to different amounts of total injected charge per unit area.

Along these lines, see FIG. 9 which demonstrates this effect for device of the type illustrated in FIG. 1. In FIG. 9, the electron transfer efficiency $\alpha$ for a moderately "on" state of a device is plotted as a function of the emitter voltage for a constant base voltage condition before and after various amounts of electron injection from the emitter in the range of about $1 \times 10^{-4}$ to about $1 \times 10^{-2}$ coul/cm$^2$. For any base voltage condition, a decrease in the transfer efficiency occurs with an increasing amount of current passage through the structure. Permanent electron trapping in the oxide layers changes local electric field patterns and degrades the transfer efficiency. Trapping in oxide layers, particularly near the grid or base region, appears to be the limiting degradation mechanism. The trapping sites are thought to be related to water impurities incorporated in the film during growth or processing and can be reduced by annealing of the layers at high temperatures such as about 1000° C. in an inert gas such as nitrogen and/or by employing thinner layers.

Figure 2:
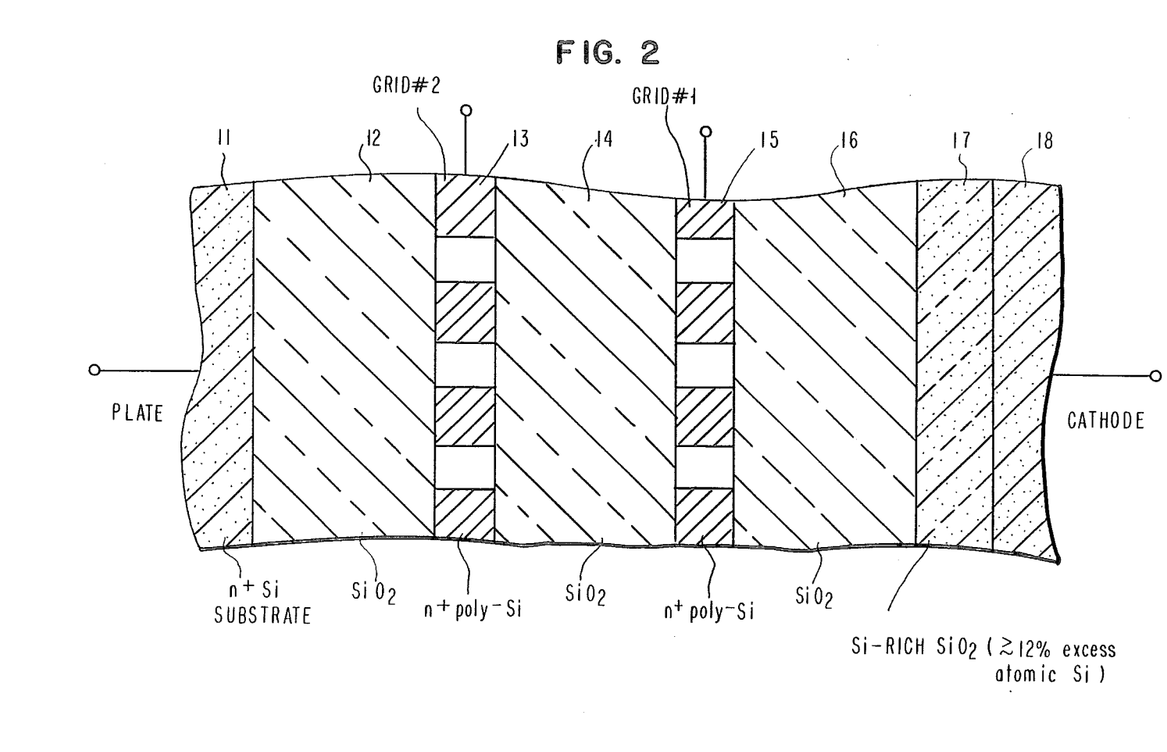
FIG. 2 is a schematic diagram of a further embodiment of a permeable-base transistor in accordance with the present invention.

Reference to FIG. 2 illustrates another embodiment within the scope of the present invention and particularly, a voltage amplifier that can be considered a solid-state analog of a tetrode. Reference to FIG. 2 illustrates an n-doped silicon substrate (11) which acts as the anode or plate of the device. Adjacent the substrate is an insulator layer (12), preferably silicon dioxide. Layer (12) is typically about 50 to about 3500 angstroms thick. Layer (12) can be provided by thermal oxidation of the adjacent substrate layer (11). Adjacent insulator layer (12) is a grid (13) of semiconductor or conductor material. The grid is typically about 50 angstroms to about 1 micron thick and is preferably polycrystalline silicon. However, metals such as aluminum, titanium, and chromium can be employed, as well as intermetallic silicides such as platinum silicide and palladium silicide. The grid structure contains about at least 1% void area, and more typically about 1% to about 80% void area, and preferably about 50% void area. The grid layer is doped, in the case of polycrystalline silicon, with an n-type dopant.

Adjacent the grid layer is a second insulating layer (14). The insulator layer (14) is typically about 50 to about 1000 angstroms thick and can be provided by conventional chemical vapor deposition techniques. A second grid layer (15) is adjacent the second insulator layer and can be of the same types of material and thicknesses as discussed above for the first grid layer (13). Grid layers (13) and (15) can be fabricated in the same manner as discussed above for grid layer (4) in FIG. 1. Adjacent the second grid layer (15) is a further insulating layer (16) that is typically about 50 angstroms to about 1000 angstroms thick. Preferably the insulator layer is silicon dioxide which can be provided by conventional chemical vapor deposition techniques.

Adjacent this third insulating layer (16) is an injector that includes a silicon-rich insulator material and a conductor or semiconductor layer adjacent thereto. The silicon-rich insulator layer (17) preferably contains at least 10% excess of atomic silicon and generally up to about 50% excess by volume. A typical value being about 12% excess. The silicon-rich insulator layer is preferably about 100 to about 1000 angstroms thick and can be provided by the technique discussed above for silicon-rich insulator layer (7) illustrated in FIG. 1 and also as discussed in DiMaria, et al., Journal of Applied Physics, Vol. 57, (7) July 1981, pages 4825–4842. The conductor or semiconductor layer (18) is preferably polycrystalline silicon that is n+ doped. As illustrated, each of substrate (11), grid (13), grid (15), and layer (18) are connected to ohmic electrical connections. The structure illustrated in FIG. 2 could provide voltage amplification.

Having thus described our invention, what we claim as new and desire to secure by Letters Patent is:

1. A semiconductor structure comprising a semiconductor substrate;
   an insulating layer adjacent said substrate;
   at least one semiconductor or conductor grid adjacent said insulating layer and separated from said substrate by said insulating layer;
   a second insulating layer adjacent said grid;
   an injector adjacent said second insulating layer and separated from said semiconductor grid by said second insulating layer; and
   said injector comprising a layer of Si rich insulation material and a layer of semiconductor material adjacent said Si enriched insulator material wherein said Si enriched insulation material is adjacent said second insulating layer.

2. The semiconductor structure of claim 1 wherein said substrate is a silicon substrate.

3. The semiconductor structure of claim 1 wherein at least about 1% of the area of said grid is void space.

4. The semiconductor structure of claim 1 wherein about 1% to about 80% of the area of said grid is void space.

5. The semiconductor structure of claim 1 wherein about 50% of the area of said grid is void space.

6. The semiconductor structure of claim 1 wherein said grid is a semiconductor.

7. The semiconductor structure of claim 1 wherein said grid is polycrystalline silicon.

8. The semiconductor structure of claim 1 wherein said insulating layers are silicon dioxide.

9. The semiconductor structure of claim 1 wherein said silicon-rich insulator material is silicon-rich silicon dioxide containing at least about 10% excess atomic silicon.

10. The semiconductor structure of claim 1 wherein the layer adjacent said silicon-rich insulator material is polycrystalline silicon.

11. The semiconductor structure of claim 1 which further includes a further insulation layer and a further semiconductor grid intermediate said at least one semiconductor or conductor grid and said second insulating layer.

* * * * *